(12) United States Patent
Rey

(10) Patent No.: US 10,280,075 B2
(45) Date of Patent: May 7, 2019

(54) METHOD OF ENCAPSULATING A MICROELECTRONIC COMPONENT

(71) Applicant: Commissariat a L'Energie Atomique et aux Energies Alternatives, Paris (FR)

(72) Inventor: Patrice Rey, St Jean de Moirans (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 1 day.

(21) Appl. No.: 15/297,662

(22) Filed: Oct. 19, 2016

(65) Prior Publication Data

US 2017/0113925 A1    Apr. 27, 2017

(30) Foreign Application Priority Data

Oct. 21, 2015   (FR) ..................... 15 60031

(51) Int. Cl.
*B81C 1/00* (2006.01)

(52) U.S. Cl.
CPC ........ *B81C 1/0023* (2013.01); *B81C 1/00333* (2013.01); *B81C 2201/014* (2013.01); *B81C 2201/0108* (2013.01); *B81C 2201/0109* (2013.01); *B81C 2201/0126* (2013.01); *B81C 2201/056* (2013.01); *B81C 2203/01* (2013.01); *B81C 2203/0792* (2013.01)

(58) Field of Classification Search
CPC .. B81C 1/00539; B81B 7/0032; B81B 3/0021
See application file for complete search history.

(56) References Cited

U.S. PATENT DOCUMENTS

| 6,472,739 B1 | 10/2002 | Wood et al. |
| 2008/0290494 A1 | 11/2008 | Lutz et al. |
| 2010/0258882 A1 | 10/2010 | Magnee et al. |

(Continued)

FOREIGN PATENT DOCUMENTS

| DE | 10 2011 077 933 A1 | 12/2012 |
| EP | 1 101 730 A2 | 5/2001 |

(Continued)

OTHER PUBLICATIONS

U.S. Appl. No. 14/260,539, filed Apr. 24, 2014, Yannick Deimerly, et al.

(Continued)

*Primary Examiner* — Mohammad M Choudhry
(74) *Attorney, Agent, or Firm* — Oblon, McClelland, Maier & Neustadt, L.L.P.

(57) ABSTRACT

A method for encapsulation of microelectronic components includes making a portion of sacrificial material on a front face of a first substrate in which the component is to be made. The method then includes making a cover encapsulating the portion of sacrificial material, and making the component by etching the first substrate from its back face. The etching is such that part of the component faces the portion of the sacrificial material, and such that the portion of sacrificial material is accessible from a back face of the component. The method then includes eliminating the portion of the sacrificial material by etching from the back face of the component, and securing the back face of the component to a second substrate.

11 Claims, 6 Drawing Sheets

(56) References Cited

U.S. PATENT DOCUMENTS

2014/0131820 A1    5/2014    Nasiri et al.

FOREIGN PATENT DOCUMENTS

FR            2 970 116         7/2012
WO    WO 2012/093105 A1    7/2012

OTHER PUBLICATIONS

U.S. Appl. No. 14/364,348, filed Jun. 11, 2014, Guillaume Jourdan, et al.
U.S. Appl. No. 14/737,761, filed Jun. 12, 2015, Haykel Ben Jamaa, et al.
U.S. Appl. No. 15/248,756, filed Aug. 26, 2016, Patrice Rey, et al.
French Preliminary Search Report dated Jul. 19, 2016 in French Application 15 60031 filed on Oct. 21, 2015.

METHOD OF ENCAPSULATING A MICROELECTRONIC COMPONENT

TECHNICAL DOMAIN AND PRIOR ART

This invention relates to a method for encapsulation of at least one microelectronic component. One embodiment of the invention is advantageously used for a wafer level collective encapsulation of MEMS (MicroElectroMechanical System) and/or NEMS (NanoElectroMechanical System) type electromicroelectronic components.

MEMS/NEMS type microelectronic components are very widespread and are used for a large number of applications (automobile for example as in airbag type systems, medical for example as in pacemakers, military, aeronautical, mobile telephone, video games, etc.) due to their very small size, low cost and good reliability. For example, most smart phones comprise a MEMS sensor to measure acceleration, rotation speed and magnetic field along three axes (sensor with nine degrees of freedom). Microelectronic components sensitive to these magnitudes comprise one or several mobile microstructures. For example, an accelerometer comprises a mobile mass, the displacement of which under the effect of an acceleration, acts on detection elements (of the capacitive type, piezoresistive type, etc.).

These mobile microstructures are very fragile and must be encapsulated so that fabrication steps carried out after they have been released (particularly the step to cut the substrate on which the microelectronic components were made into individual chips) can be carried out on them, and to protect them from the external environment during their use. Encapsulation consists of enclosing the microelectronic component in a cavity delimited between the cover and the substrate on which the microelectronic component is made. This cavity is usually hermetically sealed under a neutral gas or under a vacuum to prevent any chemical reaction between the external medium and the microelectronic component. The hermeticity of the cavity is such that the stability of the atmosphere trapped in the cavity is guaranteed. Hermeticity also guarantees that the pressure inside the cavity is maintained, which can be a determining factor for correct operation of the microelectronic component.

One of the most widespread solutions for encapsulating this type of microelectronic component consists of transferring a cover machined in a second substrate onto the component support substrate. The transfer of the cover onto the substrate containing the microelectronic components is carried out collectively, at wafer level, in other words simultaneously for all microelectronic components present on the substrate. There are several hermetic sealing methods for securing the cover to the support structure in a sealed manner, for example eutectic sealing involving a reaction between two materials (for example gold and silicon, or aluminium and germanium) to form an alloy, anodic sealing, polymer sealing, etc. Documents US 2014/0131820 A1 and DE 10 2011 077 933 A1 describe such encapsulations.

However this type of encapsulation of the cover has several disadvantages. Firstly, the encapsulation structure obtained is thick. The thickness of the cover is generally the same as the thickness of a classical semiconductor substrate, namely about 750 μm for a standard 200 mm diameter substrate. This thickness can be reduced after sealing by thinning the cover. Nevertheless, it is difficult to reduce this thickness below 200 μm due to mechanical strength reasons. Furthermore, such a method is complex to implement because the number of steps necessary to make the cover can be large.

One solution to solve thickness problems related to transferring a substrate to form the cover is to encapsulate the microelectronic component by a cover formed by deposition of a thin layer. The method consists of covering each microelectronic component with a sacrificial material itself covered with a thin encapsulation layer that forms the cover. The sacrificial material is then etched through an opening formed through the encapsulation layer. The result of these steps is the formation of a cavity delimited by the cover above the microelectronic component. Then the hole through which the sacrificial material is etched can be sealed hermetically by an appropriate deposit.

Document U.S. Pat. No. 6,472,739 B1 describes such a thin layer encapsulation method. In particular, it describes that the sacrificial material can be structured to cover only part of the microelectronic component, for example leaving its contact pads exposed. This structuring can be made by photolithography if the sacrificial material is a photosensitive material.

However a method of this type has several disadvantages. Firstly, since the sacrificial material is dispensed directly on the mobile structures of the component, it can damage these microstructures. The sacrificial material, that may for example be a photosensitive resin, infiltrates into the microelectronic component, particularly in gaps and under mobile structures, which can make it very difficult to eliminate it. This is why this method is not very suitable for the encapsulation of thick components, for example equal to or more than about 3 μm thick.

Document WO 2012/093105 A1 also describes a method for encapsulation of a microelectronic component by a thin layer. In this method, the cover is reinforced by deposition of a thick layer to maintain the conditions under which an over-moulding step is done later (pressure between about 100 and 200 bars, temperature between about 150° C. and 200° C. for a few tens of seconds). The sacrificial material is etched from the back face of the substrate. Once again, since the component is made before the thin cover, the deposition of the layer of sacrificial material can cause irreversible damage to the microelectronic component, particularly on mobile structures of the component. Furthermore, the sacrificial material is difficult to eliminate from the back face of the substrate if, for example, the structure of the microelectronic component includes deep and narrow trenches.

Document US 2008/0290494 A1 describes an encapsulation method in which the mobile structure of a microelectronic component is released from the back face of the substrate. The method consists of etching the mobile structure of the microelectronic component in the silicon surface layer of an SOI "Silicon On Insulator" substrate, and then filling the etched trenches with a dielectric material such as $SiO_2$, $Si_3N_4$, PSG (PhosphoSilicate Glass), BPSG (BoroPhosphoSilicate Glass), or spin on glass, so that the method can be continued (transfer the protection cover, make electrical connections, etc.), on a plane surface. However, filling of variable width and more than a few microns deep trenches with the dielectric material causes major technological implementation problems because these deposits must be conforming and must follow the relief of the surfaces on which the deposits are made as closely as possible, and the thickness of the deposited material must be equal to at least half of the widest of the trenches (which is not no longer reasonably possible above a few microns) and it must be possible to etch it selectively with respect to the silicon from which the microelectronic component is made.

SiO$_2$ is the material most frequently used as a sacrificial material for making thin covers. However, it is impossible to envisage making confirming deposits of SiO$_2$ more than a few microns thick. Thermal oxidation of silicon can give an SiO$_2$ layer with excellent conformity. However, thicknesses of more than 2 or 3 microns cannot be obtained with this type of thermal oxidation. Furthermore, thermal oxidation is accompanied by a consumption of silicon, modifying the critical dimensions of the mechanical structure formed from this silicon.

Si$_3$N$_4$ is a material that is not frequently used as a sacrificial material. It is a highly stressed material when it is in its stoechiometric form and deposited thicknesses do not usually exceed 2 microns or even 1 micron. It is also resistant to hydrofluoric acid (HF) and etching rates with phosphoric acid, the etching agent usually used to eliminate Si$_3$N$_4$, are very low.

Finally, glass type materials are not very conforming and leave residues when they are etched with HF-based solutions.

Thus, none of the above sacrificial materials is suitable for implementation of encapsulation like that described in document US 2008/0290494 A1.

In the encapsulation methods described in the previously mentioned documents, the thin cover is made after the microelectronic component is etched in the substrate, sometimes even after the mobile parts of the component have been released, which always creates technological problems related to planarisation of the surface that is necessary before fabrication of the cover can be continued.

Therefore, encapsulation by thin layer packaging can reduce the size of the encapsulation structure of the microelectronic component. However, known techniques for implementation of this type of encapsulation are not applicable when the microelectronic component comprises mobile parts and/or when its topology is important.

PRESENTATION OF THE INVENTION

Therefore there is a need to disclose a method of encapsulation of a microelectronic component that does not have the disadvantages mentioned above in relation to methods in prior art, namely:
- with which an compact encapsulation structure can be made,
- eliminating risks of damage to the microelectronic component related to the deposit of a sacrificial material,
- facilitating the deposit and elimination of the sacrificial material,
- that is adapted to the encapsulation of thick microelectronic components, for example about 3 μm or thicker, and/or with texture (for example trenches) with large dimensions, for example equal to or larger than a few tens of microns.

One embodiment achieves this by using a method of encapsulating at least one microelectronic component including the implementation of at least the following steps:
- making of at least one portion of sacrificial material on a front face of a first substrate in which the microelectronic component is intended to be made;
- making of at least one cover encapsulating at least the portion of sacrificial material;
- making of the microelectronic component by etching the first substrate from a back face of the first substrate (face opposite the front face of the first substrate), such that at least part of the microelectronic component is arranged to face the portion of sacrificial material and such that the portion of sacrificial material is accessible from a back face of the microelectronic component;
- elimination of the portion of sacrificial material by etching from the back face of the microelectronic component;
- securing of the back face of the microelectronic component to a second substrate.

The term "microelectronic component" is used herein to denote any type of microelectronic component and particularly MEMS and/or NEMS devices.

This encapsulation method can be used to make a compact encapsulation structure because the cover can be made by the deposition of an encapsulation layer.

Since the microelectronic component is made in the first substrate after the portion of sacrificial material on which the cover is formed has been made, risks of deterioration of the microelectronic component related to the deposition of a sacrificial material on the microelectronic component are eliminated. This also facilitates deposition and elimination of this sacrificial material because there is no need to deposit this sacrificial material in parts of the microelectronic component with difficult access, for example such as in gaps or under some parts of the microelectronic component. The result is that this encapsulation method is suitable for the encapsulation of thick microelectronic components and/or microelectronic components that have surface structuring with large dimensions.

This method can advantageously be used to encapsulate microelectronic components corresponding to MEMS structures with strong topology, typically comprising mobile silicon structures etched by DRIE (Deep Reactive Ion Etching) over depths of several microns, and possible several tens or several hundreds of microns.

Moreover, due to the fact that the microelectronic component is made in the first substrate after the making of the portion of sacrificial material on which the cover is formed, elimination of the sacrificial material from the back face of the microelectronic component is easier, so that the integrity of the cover produced can be maintained (there is no need for a release hole to be formed through the cover).

The thickness of the encapsulation produced can be very small and is limited only by stiffness considerations that depend on a number of factors (surface, type of components, etc.). For example, with a MEMS type microelectronic component with a thickness equal to about 20 μm thick secured onto a second substrate corresponding to a thinned ASIC (Application-Specific Integrated Circuit) with a thickness of about 100 μm, the total thickness of the encapsulation structure is about 120 μm.

The cover encapsulates at least the portion of sacrificial material, which means that the cover is arranged on the portion of sacrificial material and also covers at least part of the side walls of the portion of sacrificial material.

The etching used to make the microelectronic component in the first substrate can form at least one trench passing through the entire thickness of the first substrate, can delimit said part of the microelectronic component and can form an access to the portion of sacrificial material from the back face of the microelectronic component.

Thus, the step to make the microelectronic component is also useful to form accesses for etching the portion of sacrificial material later.

The method may also include implementation of the following steps between the making of the cover and the making of the microelectronic component:

making of a temporary handle secured to the cover;

thinning of the first substrate such that a remaining thickness of the first substrate corresponds to a thickness of the microelectronic component;

and the temporary handle may be decoupled from the cover after the back face of the microelectronic component has been secured to the second substrate. It is thus possible to initially use a first substrate with a thickness equal to more than the required thickness of the microelectronic component.

Fabrication of the cover can include a step to deposit an encapsulation layer more than about 10 μm thick, and advantageously less than about 5 μm.

The method may be used collectively to simultaneously encapsulate several microelectronic components made in the first substrate.

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Refer to FIGS. 1 to 18 that show the steps in a particular embodiment of a method for encapsulation of a microelectronic component 100.

Figure 1:
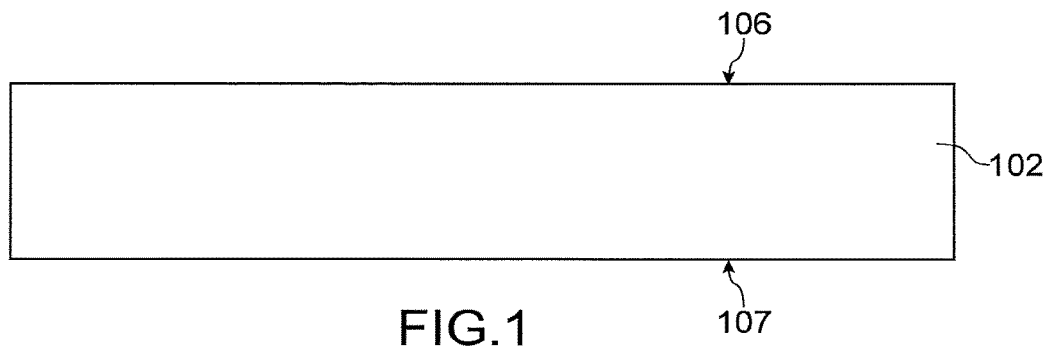
FIGS. 1 to 18 show the steps in a particular embodiment of a method for encapsulation of a microelectronic component according to one particular embodiment.
Figure 2:
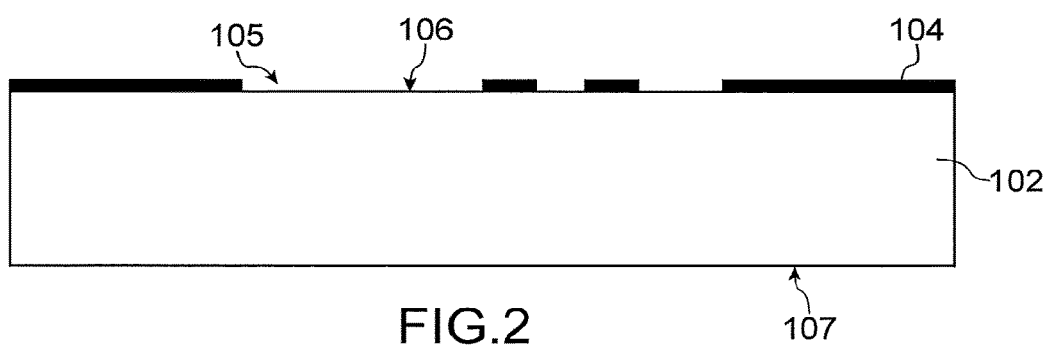

The method begins using a first substrate 102, for example made of a semiconductor such as silicon, starting from which the microelectronic component 100 will be made (FIG. 1).

A protection layer 104 comprising a material resistant to at least one etching agent that will be used later to etch a sacrificial material that will be use to form the cavity in which the component 100 will be encapsulated, is deposited on a front face 106 of the first substrate 102. The front face 106 is plane, as is a back face 107 of the first substrate 102. For example, when the sacrificial material that will be used to form the cavity is $SiO_2$ that will be chemically etched using a hydrofluoric acid solution, the protective layer 104 may be an $Si_3N_4$ layer. The thickness of the protection layer 104 may for example be between about 0.2 μm and 1 μm. Parts of the protection layer 104 are then etched (FIG. 2), forming one or several openings 105 in which the sacrificial material will be arranged and that will form part of the cavity in which the component 100 will be encapsulated.

Figure 3:
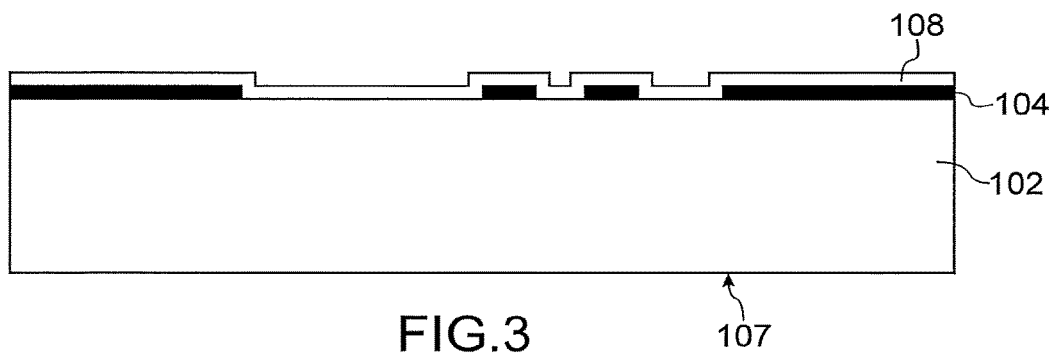

A first layer of sacrificial material 108 is then deposited on the protection layer 104 in a conforming manner, and on the parts of the front face 106 of the first substrate 102 not covered by the protection layer 104, in other words in the openings 105 (FIG. 3). The thickness of this first layer of sacrificial material 108 is greater than or equal to the thickness of the protection layer 104 so that the openings 105 are filled by the sacrificial material of the first layer 108. The sacrificial layer of this first layer 108 is chosen as a function of the etching agent that will be used later to form the cavity in which the component 100 will be encapsulated. The material in the first layer 108 may for example be $SiO_2$ that will be etched by a solution of hydrofluoric acid, or a polymer that will be eliminated by $O_2$ plasma etching. In general, the sacrificial material of the first layer 108 may be a dielectric material, a polymer or a metal.

Figure 4:
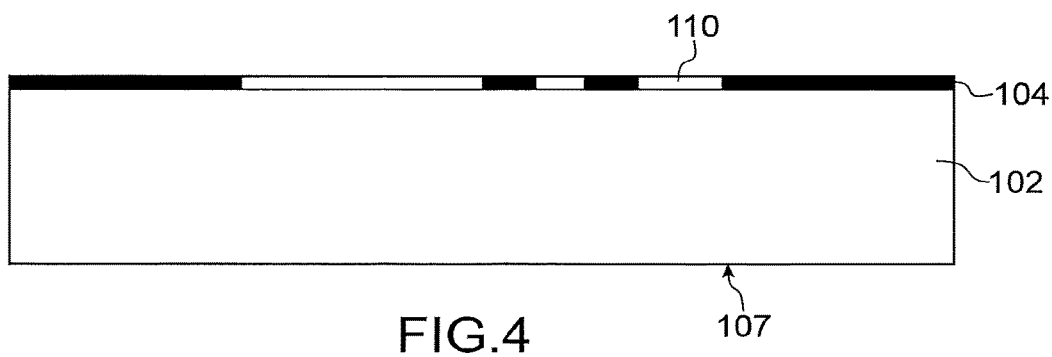

As shown on FIG. 4, a planarisation step is carried out to eliminate parts of the first layer of sacrificial material 108 that are not deposited in the openings 105 and that cover the protection layer 104. This planarisation can be stopped when the upper face of the protection layer 104 is reached. Therefore only the remaining portions 110 of sacrificial material filling the openings 105 are kept, these remaining portions 110 forming, with the protection layer 104, a plane layer covering the top face 106 of the first substrate 102. Therefore the thickness of the remaining portions 110 is equal to the thickness of the protection layer 104.

As a variant, instead of making these remaining portions 110 by a deposit as described above with reference to FIG. 3, these portions 110 can be obtained by the use of thermal oxidation of the semiconductor of the substrate 102 through the openings 105.

Figure 5:
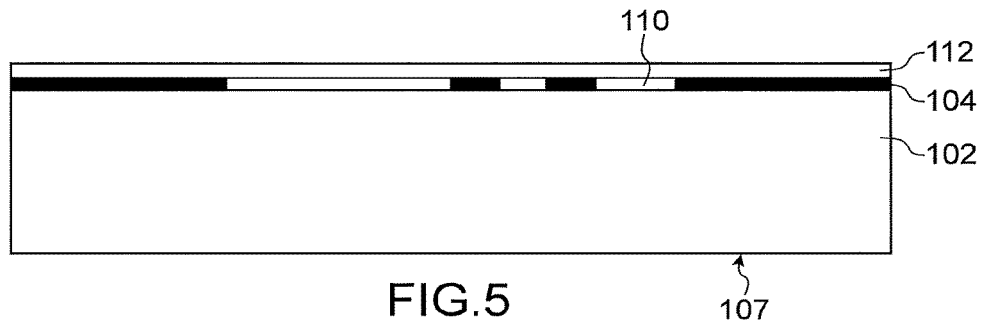

A second layer of sacrificial material 112, for example comprising the same sacrificial material as portions 110, is then made for example by deposition over the entire front face of the previously made structure, in other words on the remaining portions 110 and on the protection layer 104 (FIG. 5). The thickness of this second layer 112 is chosen such that the sum of the thicknesses of the second layer 112 and portions 110 is approximately equal to the height of the required empty space above the component 100 when it will be encapsulated. The thickness of the second layer of sacrificial material 112 may for example be between about 0.5 μm and 3 μm.

Figure 6:
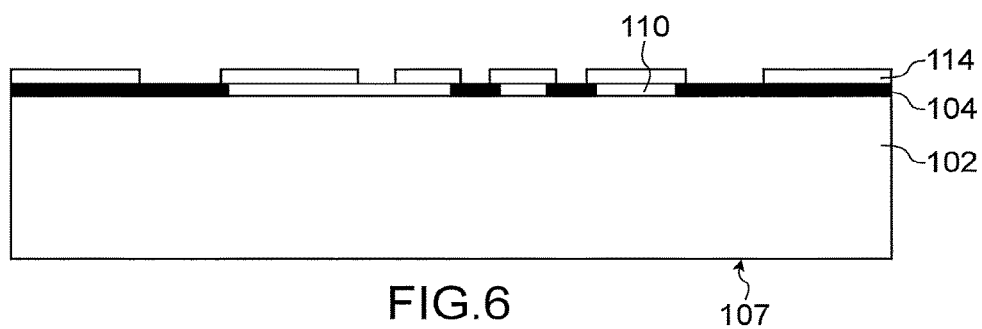

On FIG. 6, the second layer 112 is then etched so that the remaining portions 114 of this second layer 112 define one or several future zones anchoring the cover to the first substrate 102 (through the protection layer 104) and one or several stops for one or several mobile elements of the component 100, adjacent to the portions of the second layer. Furthermore, the remaining portions 114 of the second layer of sacrificial material 112 at least partly cover the remaining portions 110 of the first layer of sacrificial material 108 so that the etching agent that will be used afterwards can reach the remaining portions 114 from the back face of the component 100.

Figure 7:
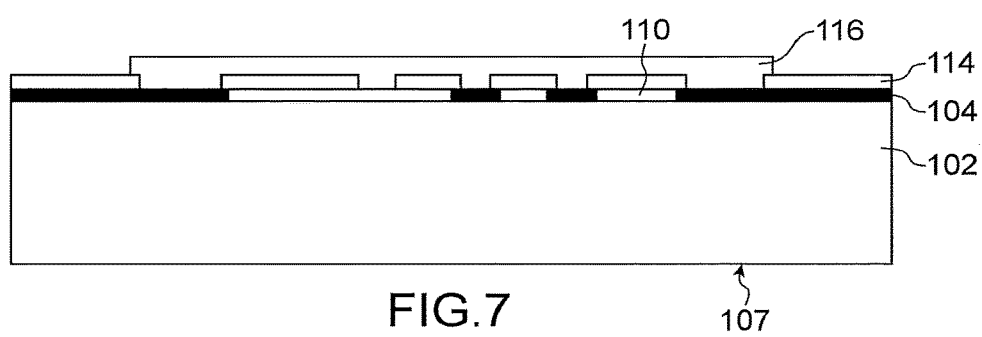
Figure 8:
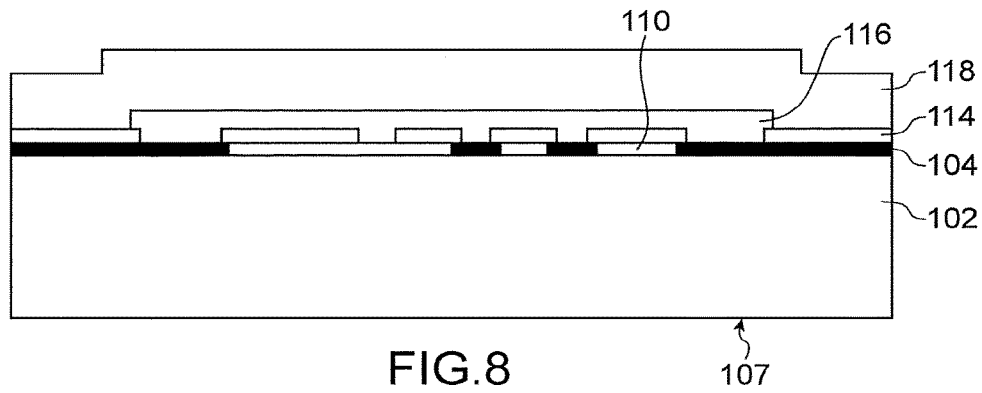

The cover 116 is then made by depositing an encapsulation layer particularly covering the remaining portions 114 and filling in the openings formed between the portions 114 (FIG. 7). The parts of the encapsulation layer deposited in the openings formed between the portions 114 form the anchor zones and the stop(s). The encapsulation layer may be etched so as to delimit the cover 116 in the principal plane of the first substrate 102 (plane parallel to faces 106, 107 of the first substrate 102). The material of the cover 116 is chosen to resist the etching agent that will be used to etch the remaining portions 110 and 114. For example, if this etching agent is a solution of hydrofluoric acid and the sacrificial material is $SiO_2$, the cover 116 may include polycrystalline silicon. When the sacrificial material is a polymer that will be etched by an organic compound or by an $O_2$ plasma, the cover 116 may contain $SiO_2$. The material chosen for the cover 116 must be such that etching of the sacrificial material applied later is sufficiently selective relative to the material of the cover 116, otherwise it will be etched completely when the sacrificial material is etched. The thickness of the deposited encapsulation layer is advantageously between about 0.5 µm and 10 µm.

A temporary handle is then made on the cover 116. As shown on FIG. 8, this is done by depositing a securing layer 118 to which a temporary substrate will be secured, on the previously made structure thus covering the cover 116 and the remaining portions 114 not covered by the cover 116. The material of the securing layer 118 is chosen so that it can be etched selectively relative to the material of the cover 116. For example, when the cover 116 is made of silicon, the material of the securing layer 118 may be $SiO_2$, $Si_3N_4$, or even PSG or BPSG glass. Thus, this securing layer 118 advantageously comprises a material similar to the material in the remaining portions 114, in other words in this case $SiO_2$. The thickness of this securing layer 118 is at least equal to the topology formed by the cover 116. For example, considering that the maximum variation of the height at the surface of the substrate 102 is $\Delta h$, the thickness of the securing layer 118 is advantageously chosen to be equal to about $1.5.\Delta h$. In general, the thickness of the securing layer 118 is between about 1 µm and 5 µm.

Figure 9:
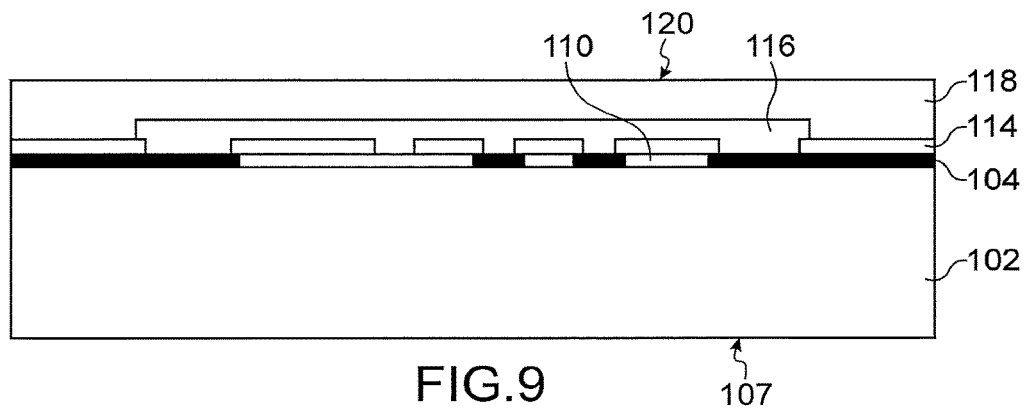

The securing layer 118 is then planarized by the use of chemical mechanical polishing (CMP) such that the top face 120 of the securing layer 118 (face opposite the face covering the cover 116) is plane and can be secured to the future temporary handle (FIG. 9).

Figure 10:
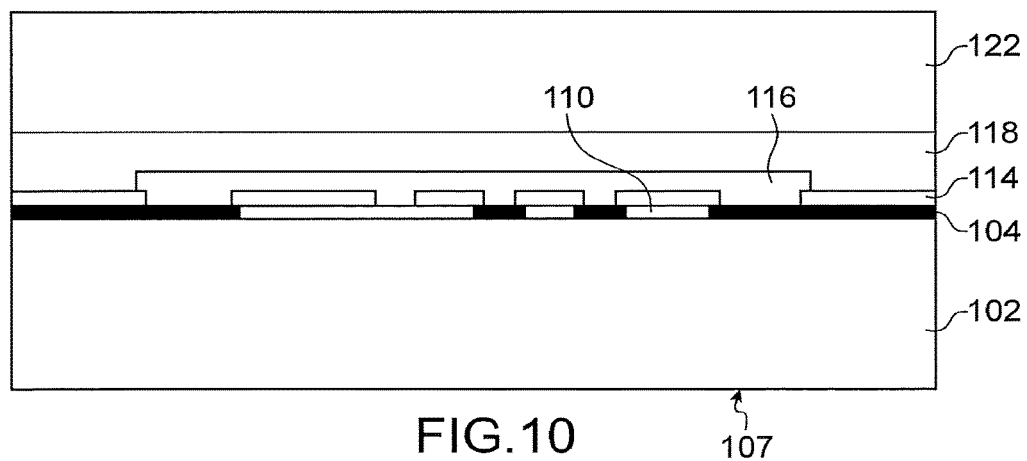

As shown on FIG. 10, a temporary substrate 122, in this case corresponding to a semiconductor substrate such as silicon, is secured to the top face 120 of the securing layer 118. This securing of the temporary substrate 122 on the top face 120 of the securing layer 118 may be made by direct bonding (if the materials of the temporary substrate 122 and of the securing layer 118 are compatible with the use of such bonding, or by using an adhesive layer arranged between the temporary substrate 122 and the securing layer 118.

Figure 11:
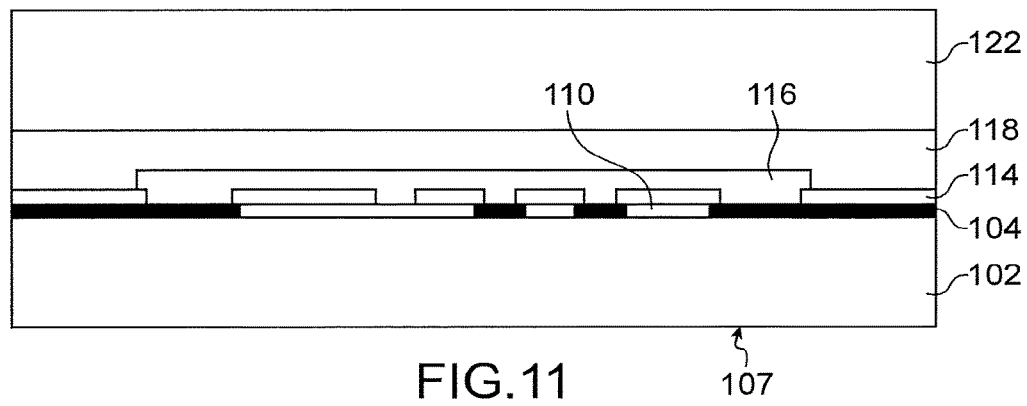

The temporary handle thus formed by the temporary substrate 122 and the securing layer 118 is then used to mechanically retain the structure made by thinning the first substrate 102 from its back face 107, as shown on FIG. 11. For example, this thinning corresponds to the use of CMP. The remaining part of the first substrate 102 will be used to make the component 100. For example, the initial thickness of the first substrate 102 is equal to about 725 µm (standard thickness of a silicon substrate with a diameter equal to 200 µm), and the final thickness of the first substrate 102 after thinning may advantageously be equal to a few tens of microns, particularly less than 100 µm. The remaining thickness of the first substrate 102 is chosen such that it corresponds to the required final thickness of the microelectronic component 100. This thinning is not done when the first substrate 102 initially has the required thickness for the component 100.

Figure 12:
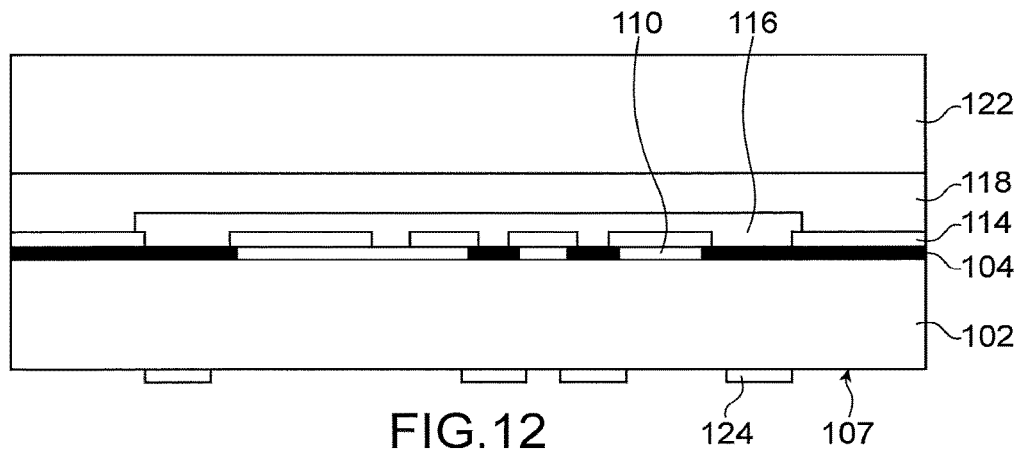
Figure 13:
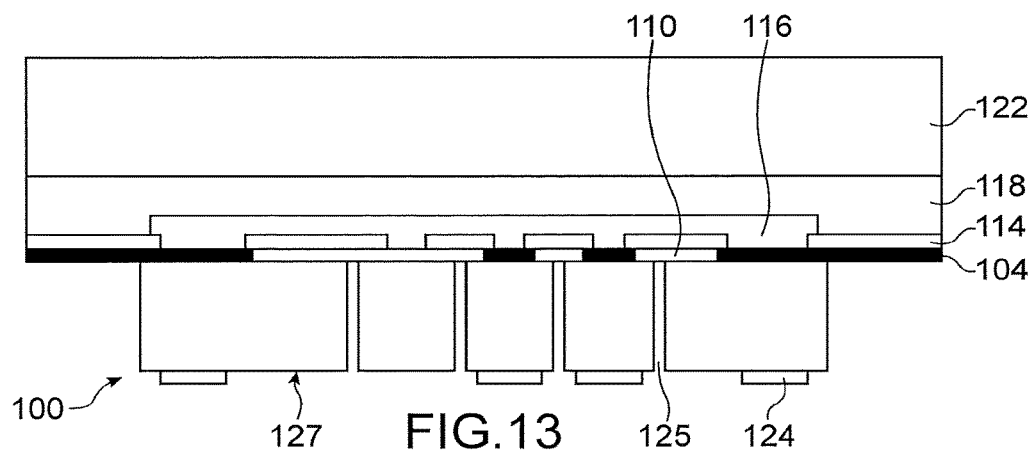

On FIG. 12, a layer of electrically conducting material, for example a metallic layer, is then deposited on the back face 107 of the first substrate 102, and is then etched such that the remaining portions of this layer form electrically conducting portions 124. For example, the electrically conducting material of the portions 124 is aluminium, this material being adapted so that AlGe eutectic bonding can then be made between these electrically conduction portions 124 and electrical interconnection elements to which the portions 124 are connected. The first substrate 102 is then etched, for example by a deep anisotropic etching of the DRIE type, from its back face 107 stopping on the protection layer 104 and on the remaining portions 110, thus forming the different parts of the microelectronic component 100 (FIG. 13). In particular, this etching forms trenches 125 passing through the entire thickness of the first substrate 102 and delimiting the fixed and mobile elements of the component 100. The component 100 is made such that at least one mobile element of the component 100 is arranged facing the remaining portions 110. The trenches 125 also form accesses from a back face 127 of the component 100 to the remaining portions 110, 114 of sacrificial material that are covered by the cover 116.

Figure 14:
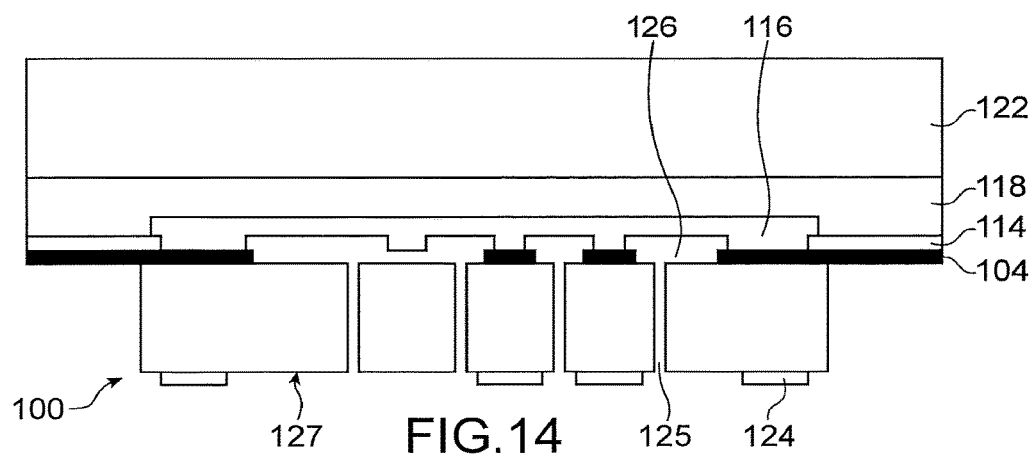

On FIG. 14, the remaining portions 110, 114 of sacrificial material are etched using the trenches 125 from the back face 127 of the component 100, forming the cavity 126 and also releasing the mobile parts of the component 100 (for example the seismic mass(es) in the case of a component 100 corresponding to an accelerometer).

Other parts of the component 100 remain secured to the protection layer 104 and/or the cover 116. This etching may be done using a liquid or vapour hydrofluoric acid solution when the sacrificial material of the remaining portions 110, 114 is $SiO_2$. When the sacrificial material of the remaining portions 110, 114 is a polymer, $O_2$ plasma type etching may be used. When etching the sacrificial material of the remaining portions 110, 114, the protection layer 104 protects some of the remaining portions 114 located outside the cavity 126 and the securing layer 118 from the etching agent used to eliminate the sacrificial material encapsulated by the cover 116.

Figure 15:
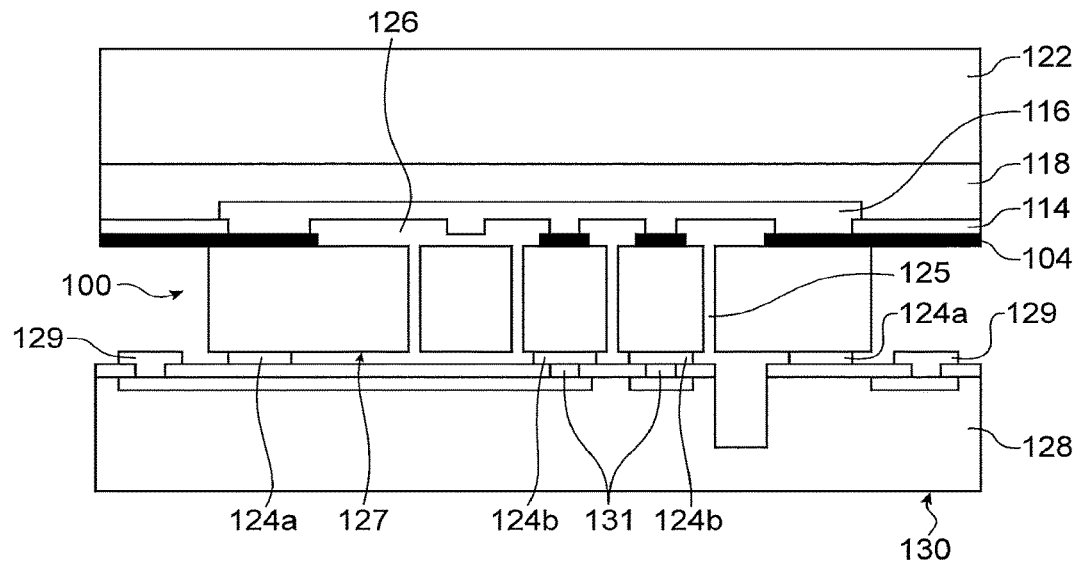
Figure 16:
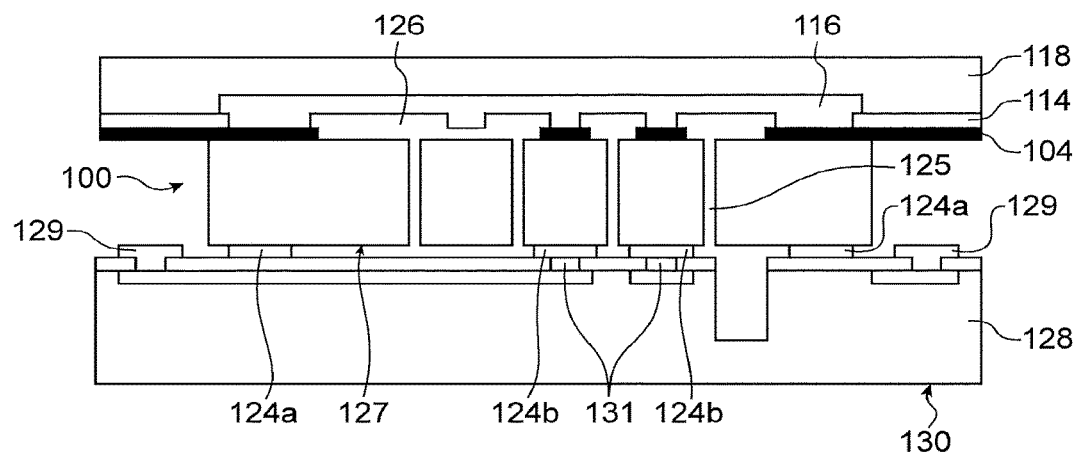

A second substrate 128 is secured to the back face 127 of the component 100 through the electrically conducting portions 124 located on the back face 127 of the component 100. The second substrate 128 is advantageously an interconnections substrate for routing different electrical parts of the component 100 to contact pads 129. This second substrate 128 may also correspond to an electronic circuit capable of reading the electrical signal(s) outputted by the component 100, for example of the ASIC type. In this case, this bonding is done hermetically so that the component 100 will be encapsulated hermetically, for example in an atmosphere under a vacuum or in a neutral gas environment between the cover 116 and the second substrate 128. Some of the electrically conduction portions 124 to which the second substrate 128 is secured (references 124*a* on FIG. 15) form a sealed or hermetic bonding bead closing or hermetically sealing the cavity 126. Other electrically conducting portions 124, referenced 124*b* on FIG. 15, are secured to electrical interconnection elements 131 of the second substrate 128 and form electrical connections between the component 100 and the electronic circuit of the second substrate 128. For example, the securing between the component 100 and the second substrate 128 is achieved by the use of eutectic bonding, for example of the AuSi type, or by thermocompression bonding. After this securing, the substrate 128 may be thinned from its back face 130, for example by CMP.

Figure 17:
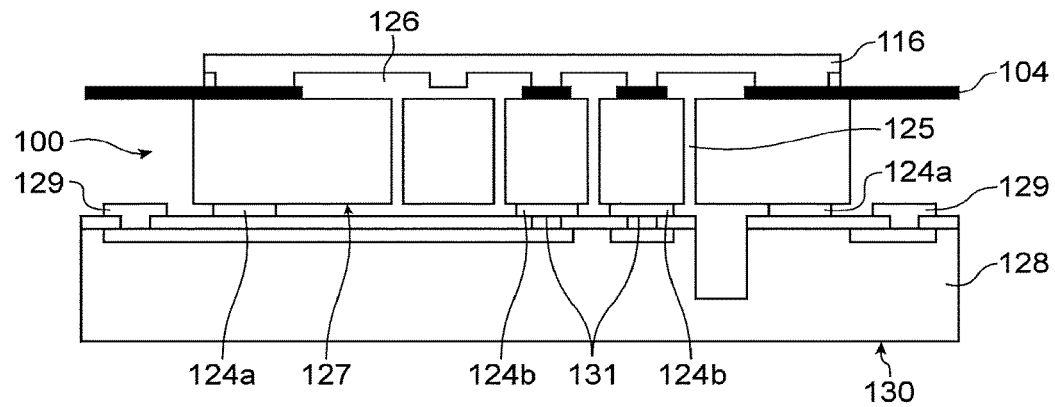

The temporary handle is then decoupled from the remaining elements firstly by removing the temporary substrate 122 (FIG. 16), and then etching the securing layer 118 (FIG. 17). The remaining portions 114 not covered by the cover 116 are also eliminated, for example by etching. As a variant, the temporary substrate 122 may be decoupled directly as a result of etching the securing layer 118.

Figure 18:
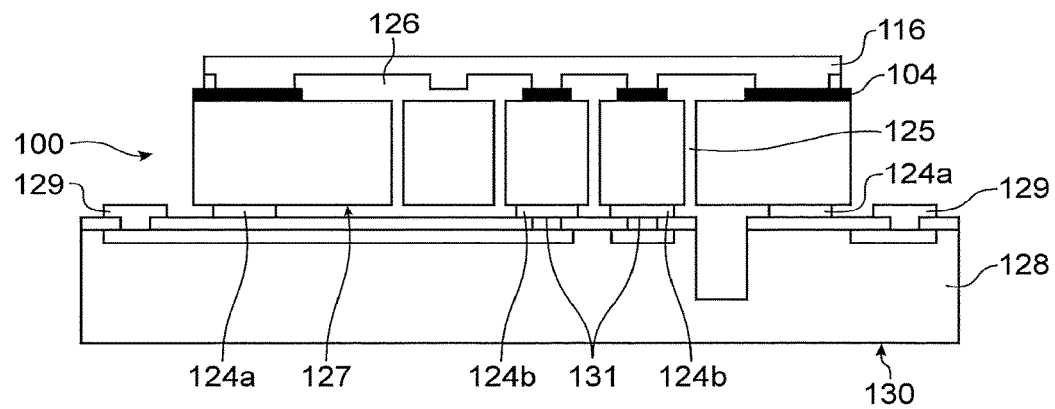

Finally, as shown on FIG. 18, the method is completed by etching the portions of the protection layer 104 that project laterally from the component 100.

The invention claimed is:

1. A method for encapsulation of at least one microelectronic component, comprising:
    making at least one portion of sacrificial material on a front face of a first substrate in which the microelectronic component is to be made, the first substrate being a single layer of semiconductor, then
    making at least one cover encapsulating at least the portion of sacrificial material, then
    making the microelectronic component by etching the first substrate from a back face of the first substrate, such that at least part of the microelectronic component is arranged to face the portion of sacrificial material and such that the portion of sacrificial material is accessible from a back face of the microelectronic component, then
    eliminating the portion of sacrificial material by etching from the back face of the microelectronic component, and then
    securing the back face of the microelectronic component to a second substrate,
    wherein the making of the microelectronic component further includes etching the first substrate to form, during said etching, at least one mobile element and at least one trench passing through an entire thickness of the first substrate, delimiting said mobile element and forming an access to the portion of sacrificial material from the back face of the microelectronic component.

2. The method according to claim 1, wherein the securing of the back face of the microelectronic component to the second substrate forms at least one electrical bond between at least one electrical interconnection element of the second substrate and at least one electrically conducting portion of the microelectronic component.

3. The method according to claim 2, wherein the second substrate comprises at least one electronic circuit configured to read at least one electrical signal outputted by the microelectronic component.

4. The method according to claim 1, wherein the securing of the back face of the microelectronic component to the second substrate is made hermetically such that at least said part of the microelectronic component is hermetically enclosed in a cavity formed between the cover and the second substrate.

5. The method according to claim 1, further comprising, between the making of the cover and the making of the microelectronic component:
    making a temporary handle secured to the cover; and
    thinning the first substrate such that a remaining thickness of the first substrate corresponds to a thickness of the microelectronic component,
    wherein the temporary handle is decoupled from the cover after the back face of the microelectronic component has been secured to the second substrate.

6. The method according to claim 5, further comprising, between the securing of the back face of the microelectronic component to the second substrate and the decoupling of the temporary handle, thinning the second substrate.

7. The method according to claim 5, wherein the making of the temporary handle includes:
    depositing a securing layer on the cover and parts of the front face of the first substrate not covered by the cover;
    planarizing the securing layer; and
    bonding a temporary substrate on the securing layer.

8. The method according to claim 1, further comprising making at least one protection layer on the front face of the first substrate before the making of the cover, wherein:
    at least part of the portion of sacrificial material is arranged in at least one opening made through the protection layer; and
    the material of the protection layer is configured to resist against the etching carried out during elimination of the portion of sacrificial material.

9. The method according to claim 7, further comprising making at least one protection layer on the front face of the first substrate before the making of the cover, wherein:
    at least part of the portion of sacrificial material is arranged in at least one opening made through the protection layer; and
    the material of the protection layer is configured to resist against the etching carried out during elimination of the portion of sacrificial material and to protect the securing layer during this etching.

10. The method according to claim 8, wherein the protection layer is made on the front face of the first substrate before the making of the portion of sacrificial material and the making of the portion of sacrificial material comprises:
    depositing at least a first layer of sacrificial material on the protection layer and in said at least one opening made through the protection layer;
    planarizing the first layer of sacrificial material stopping on the protection layer, forming at least one remaining portion of the first layer of sacrificial material arranged in said at least one opening formed through the protection layer;
    depositing at least one second layer of sacrificial material on said at least one remaining portion of the first layer of sacrificial material and on the protection layer; and
    etching the second layer of sacrificial material such that the remaining portions of the second layer of sacrificial material define at least one zone in which the cover is anchored to the first substrate and at least one stop for at least one mobile element of the microelectronic component, and such that at least one of the remaining portions of the second layer of sacrificial material at least partially covers said at least one remaining portion of the first layer of sacrificial material,
    wherein the portion of sacrificial material encapsulated by the cover corresponds to said at least one remaining portion of the first layer of sacrificial material and the remaining portions of the second layer of sacrificial material.

11. The method according to claim 1, wherein the making of the cover comprises a deposition of an encapsulation layer with a thickness of less than about 10 μm.

* * * * *